United States Patent [19]
Farnworth

[11] Patent Number: 5,487,999
[45] Date of Patent: Jan. 30, 1996

[54] METHOD FOR FABRICATING A PENETRATION LIMITED CONTACT HAVING A ROUGH TEXTURED SURFACE

[75] Inventor: Warren M. Farnworth, Nampa, Id.

[73] Assignee: Micron Technology, Inc., Boise, Id.

[21] Appl. No.: 343,730

[22] Filed: Nov. 22, 1994

Related U.S. Application Data

[63] Continuation-in-part of Ser. No. 73,005, Jun. 7, 1993, Pat. No. 5,408,190, which is a continuation-in-part of Ser. No. 709,858, Jun. 4, 1991, abandoned, and Ser. No. 788,065, Nov. 5, 1991, Pat. No. 5,440,240, and Ser. No. 981,956, Nov. 24, 1992.

[51] Int. Cl.$^6$ ................................................ H01L 21/00
[52] U.S. Cl. ........................... 437/7; 437/8; 437/180; 437/183; 437/192
[58] Field of Search ........................ 437/7, 8, 180, 437/183, 189, 192, 203, 209, 211, 217, 219, 220

[56] References Cited

U.S. PATENT DOCUMENTS

| | | | |
|---|---|---|---|
| 4,312,117 | 1/1982 | Robillard et al. | 29/589 |
| 4,899,107 | 2/1990 | Corbett et al. | 324/158 |
| 4,899,921 | 2/1990 | Bendat et al. | 228/105 |
| 4,924,589 | 5/1990 | Leedy | 29/832 |
| 4,952,272 | 8/1990 | Okino et al. | 156/630 |
| 5,072,289 | 12/1991 | Sugimoto et al. | 357/68 |
| 5,073,117 | 12/1991 | Malhi | 439/71 |
| 5,088,190 | 2/1992 | Malhi | 29/843 |
| 5,103,557 | 4/1992 | Leedy | 29/832 |
| 5,123,850 | 6/1992 | Elder et al. | 439/67 |
| 5,173,451 | 12/1992 | Kinsman et al. | 437/209 |
| 5,177,439 | 1/1993 | Liu et al. | 324/158 P |
| 5,207,585 | 5/1993 | Byrnes et al. | 439/66 |
| 5,249,450 | 10/1993 | Wood et al. | 72/359 |
| 5,264,787 | 11/1993 | Woith et al. | 324/158 |
| 5,302,891 | 4/1994 | Wood et al. | 324/158 |
| 5,323,035 | 6/1994 | Leedy | 257/248 |
| 5,326,428 | 7/1994 | Farnworth et al. | 156/654 |
| 5,342,807 | 8/1994 | Kinsman et al. | 437/209 |
| 5,367,253 | 11/1994 | Wood et al. | 324/158 F |
| 5,408,190 | 4/1995 | Wood et al. | 324/765 |

FOREIGN PATENT DOCUMENTS 3-69131  3/1991  Japan.

OTHER PUBLICATIONS

Miyake et al, "Connectivity Analysis of New Known Good Die Connection Systems Using Microbumps", Technical Paper, Mar. 22, 1993.

Yamamoto et al., "Evaluation of New Micro–Connection System Using Microbumps", ISBM '93 Proceedings, pp. 370–378, 1993.

Packard Hughes Interconnect, "Science Over Art Our New IC Membrane Test Probe", 1993.

ASMAT, Application Specific Material, Nitto Denko America, Inc. Mar. 19, 1993.

Primary Examiner—Brian E. Hearn
Assistant Examiner—Kevin M. Picardat
Attorney, Agent, or Firm—Stephen A. Gratton

[57] ABSTRACT

A method for forming contacts for establishing an electrical connection with contact locations on a semiconductor die is provided. The contacts are formed as raised members mounted on a compliant substrate. Each contact includes a rough textured surface having asperities adapted to penetrate the contact location on the die to a limited penetration depth. The height of the asperities is between about 1000Å to 10,000Å. The textured surface and asperities are formed by electroplating a rough metal layer on a raised metal contact or by etching a surface of a raised metal contact. In an illustrative embodiment the contacts comprise microbumps formed on a compliant polyimide substrate. For forming an interconnect suitable for establishing a temporary electrical connection with an unpackaged semiconductor die, the polyimide substrate is attached to a rigid substrate, such as silicon, having a coefficient of thermal expansion that matches that of a silicon die. The interconnect can then be used with a carrier for testing the unpackaged die.

37 Claims, 2 Drawing Sheets

METHOD FOR FABRICATING A PENETRATION LIMITED CONTACT HAVING A ROUGH TEXTURED SURFACE

CROSS REFERENCE TO RELATED APPLICATIONS

This application is a continuation-in-part of application Ser. No. 08/073,005 filed Jun. 7, 1993, now U.S. Pat. No. 5,408,190, which is a continuation-in-part of applications Ser. Nos. 07/709,858 filed Jun. 4, 1991, abandoned; 07/788,065 filed Nov. 5, 1991, now U.S. Pat. No. 5,440,240; and, 07/981,956 filed Nov. 24, 1992.

This application is related to copending applications Ser. Nos. 08/124,899 filed Sep. 21, 1993; 08/046,675 filed Apr. 14, 1993, now U.S. Pat. No. 5,367,253; 08/073,003 pending Jun. 7, 1993; 08/120,628 filed Sep. 13, 1993; 08/192,023 filed Feb. 3, 1994; 07/896,297 filed Jun. 10, 1992 now U.S. Pat. No. 5,424,652; 08/192,391 filed Feb. 3, 1994; and, 08/137,675 filed Oct. 14, 1993, now abandoned.

FIELD OF THE INVENTION

This invention relates to semiconductor manufacture and to testing of semiconductor dice. More particularly, this invention relates to a method for fabricating a penetration limited contact adapted to establish an electrical connection with a contact location on a semiconductor die.

BACKGROUND OF THE INVENTION

Unpackaged or bare semiconductor dice are being increasingly used in the manufacture of electronic devices that employ multi-chip modules (MCM). These unpackaged dice are mounted directly to a substrate such as a printed circuit board. With unpackaged dice, semiconductor manufacturers are required to supply dice that have been tested and certified as known good die. Known good die (KGD) is a collective term that denotes unpackaged die having the same quality and reliability as the equivalent packaged product.

For testing an unpackaged die, an electrical pathway must be established between the unpackaged die and external test circuitry. An interconnect is typically used to form a temporary electrical connection with the die. The interconnect includes the contact structure that physically contacts and forms an electrical connection with contact locations on the die.

These contact locations are typically die pads (e.g., bond pads or test pads) located on the face of the die in electrical communication with integrated circuitry. Die pads are relatively small in size and are closely packed on the face of the die. As an example, bond pads are typically polygonal in shape (e.g., square, triangular) and are only about 100 µm on a side. The spacing between bond pads is on the order of 50 to 100 µm or less. The contact structure for an interconnect must therefore be precisely formed to accommodate the size and spacing of the bond pads.

In addition, the contact structure on the interconnect preferably forms a low-resistance ohmic electrical connection with the contact location. An ohmic electrical connection is one in which the voltage appearing across the connection is proportional to the current flowing for both directions of current flow. In order to form a low-resistance ohmic connection, a contact structure must penetrate an oxide layer covering the bond pad. An aluminum bond pad for instance, will typically include a native oxide layer which forms during the manufacturing process. This oxide layer, which may be about 100Å or more in thickness, must be either penetrated or wiped away to establish an electrical connection that is ohmic. At the same time, however, damage to the bond pad must be kept to a minimum. A bond pad may only be about 1µ thick and is thus relatively easy to damage.

One well known contact structure used for forming interconnects and other connection systems is the needle probe. Needle probes however, exhibit a variety of shortcomings. In particular, needle probes are susceptible to damage, misalignment and rapid loss of contact force. In addition, needle probes may not provide uniform contact to vertically misaligned pads and may damage the pads. Needle probes also require extensive maintenance and adjustment. All of these problems are compounded by the higher integration of semiconductor dice and a corresponding decrease in the size and pitch of bond pads. This has led to the recent development of other connection systems for testing semiconductor dice at both the wafer level and the die level.

Some recently developed connection systems include compliant contact structures adapted to flex to accommodate variations in the planarity of the die pads. As an example, U.S. Pat. No. 5,264,787 to Worth et al. describes an interconnect that includes an array of metal plated contacts formed on a flexible membrane. This type of contact is manufactured by Packard-Hughes under the trademark Gold Dot™. U.S. Pat. Nos. 5,103,557 and 5,323,035 to Leedy disclose other contact structures that are mounted on a flexible substrate or membrane. In addition, U.S. Pat. No. 5,207,585 to Byrnes et al. discloses an interconnect that includes a flexible interface pellicle having electrodes for contacting raised conductive bumps on a die.

Although some prior art interconnects compensate for variations in the vertical location of pads on a die, there can still be problems in piercing an oxide layer covering the contact to form an electrical connection. Some interconnects utilize an arrangement in which the flexible membrane for mounting the contacts is tensioned prior to engagement with the die. When the tension is released, the contacts move across the die pads and scrub away the oxide layer to establish an electrical connection. Such a scrubbing action however increases the complexity of the interconnect and may damage the die pads.

One recently developed technique for preventing damage to a die pad, while establishing an electrical connection, is to limit the penetration depth of a contact into the die pad. U.S. Pat. No. 5,326,428 to Farnworth et al., the present applicant, discloses such a penetration limited contact structure. With such a contact structure, raised silicon contact members are formed on a silicon substrate. Each raised contact member includes a raised projection, such as a point or knife edge, that penetrates the die pad to establish an electrical connection. The penetration depth however, is limited by the dimensions of the projection and by a stop plane provided by a top surface of the contact member.

The present invention is directed to an improved contact structure that also includes a self limiting feature. The contact structure is especially useful for forming interconnects and other connection systems for semiconductor dice. The improved contact structure is mounted on a compliant substrate and is adapted to penetrate a contact location on a semiconductor die to a limited penetration depth to establish an electrical connection.

OBJECTS OF THE INVENTION

Accordingly, it is an object of the present invention to provide a method for forming an improved contact structure suitable for establishing an electrical connection with contact locations on a semiconductor die.

It is yet another object of the present invention to provide a method for forming an oxide penetrating contact structure on a compliant substrate.

It is a further object of the present invention to provide a method for forming an improved contact structure having a rough textured surface adapted to penetrate a contact location on a die but with a limited penetration depth.

It is a still further object of the present invention to provide a method for forming an improved contact structure suitable for forming interconnects useful in the testing of unpackaged semiconductor dice.

Other objects, advantages and capabilities of the present invention will become more apparent as the description proceeds.

SUMMARY OF THE INVENTION

In accordance with the present invention, a method for forming a contact structure for establishing an electrical connection with contact locations on a semiconductor die is provided. The contact structure, simply stated, includes a raised projection, such as a microbump, mounted on a compliant substrate and having a rough textured surface. The rough textured surface includes raised asperities adapted to penetrate a contact location such as a die pad. At the same time, a penetration depth into the contact location is limited by the dimensions of the asperities. By way of example, for a contact structure formed as a convex microbump having a diameter of about 30μ, the asperities will have a height of about 1,000Å to 10,000Å.

A method for forming the contact structure, simply stated, comprises fabricating a raised contact on a compliant substrate, and then forming a rough textured surface on the raised contact. The rough textured surface can be formed by depositing a rough metal layer on the raised contact using an electrolytic plating process. Alternately the rough textured surface can be formed by etching the raised contact to produce a rough surface.

For forming a rough textured surface on the contact using an electrolytic plating process, the raised contact is submerged in a tank containing an electrolytic solution and connected to an electric potential. An electric current is passed through the raised contact and through an electrode contained in the solution. This causes metal ions in the solution to deposit onto the raised contact. Because the surface of the base metal which forms the raised contact possesses an inherent roughness, the plated layer begins to form with asperities or nodules and a rough or textured surface forms on the contact. Additionally, process parameters are controlled to enhance the roughness of the plated layer. For a raised contact formed of a base metal such as aluminum, the plated layer can be a material such as nickel, molybdenum, tungsten, platinum, iridium or gold, which has a more positive electromotive potential than aluminum.

For forming a rough surface using an etching process, the raised contact is formed and then etched using a wet or dry etch process. For a wet etching process a wet etchant such as an acid can be used to enhance granular boundaries and roughen the surface of the contact. Etching can also be performed using a dry etch process such as plasma etching, ion milling, or reactive ion etching.

In an illustrative embodiment, the raised contact is a microbump formed of a base metal and attached to a polyimide substrate. The polyimide substrate includes an electrically conductive trace in electrical communication with the microbump. For forming an interconnect useful in testing discrete die, the polyimide substrate is attached to a rigid substrate formed of a material such as silicon, having a coefficient of thermal expansion that closely matches a silicon die.

DETAILED DESCRIPTION OF THE INVENTION

The method of the invention is adapted to form a contact structure and includes the steps of:

providing a compliant substrate;

attaching a metal layer to the compliant substrate;

patterning the metal layer to form conductive traces;

etching openings through the compliant substrate to the conductive traces;

forming raised contacts in the openings in electrical communication with the conductive traces; and then forming a rough textured surface on the raised contacts by electroplating or etching.

Figure 1A:
FIGS. 1A–1E are schematic cross sectional drawings illustrating a process for forming contacts in accordance with the method of the invention.

Referring to FIGS. 1A–1E, the above identified method is illustrated in schematic form. In FIG. 1A, a polyimide substrate 10 is provided. The polyimide substrate 10 can be molded or fabricated out of a sheet of polyimide material. Polyimide tapes are commercially available from DuPont and are sold under the trademark Kapton™. A layer of metal foil 12 is attached to the polyimide substrate 10. The polyimide substrate 10 can be cast onto the layer of foil 12 and then cured to form a unitary structure. The polyimide substrate 10 forms a compliant electrically insulating substrate.

Figure 1B:
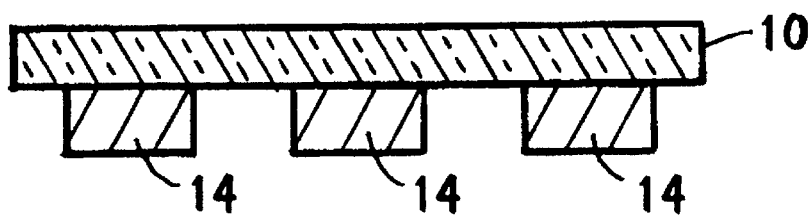

Next, as shown in FIG. 1B, the metal foil 12 is patterned and etched to form a pattern of conductive traces 14 on the polyimide substrate 10. The metal foil is formed of a highly conductive material such as copper or aluminum. Patterning and etching can be performed using a photolithographic process in which a layer of photoresist is applied to the metal foil 12, exposed, and then developed to form a mask for etching using a wet etchant. One suitable wet etchant for a metal foil 12 formed of copper is sulphuric acid. For aluminum, suitable wet etchants include NaOH and KOH.

Figure 1C:
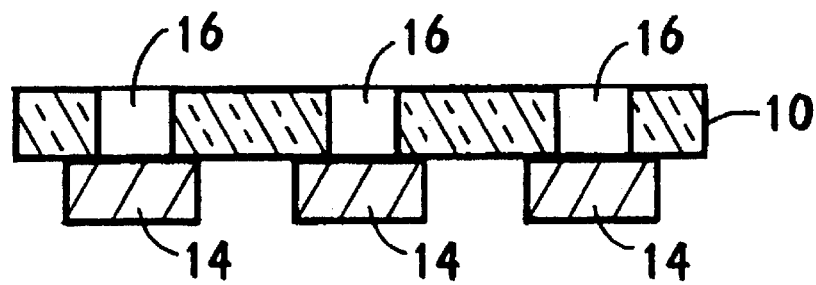

Next, as shown in FIG. 1C, a pattern of openings 16 is etched through the polyimide substrate 10 to the conductive traces 14. Again, a photomask can be formed and a wet etchant such as hydrazine used to etch the polyimide substrate 10 with the pattern of openings 16.

Figure 1D:
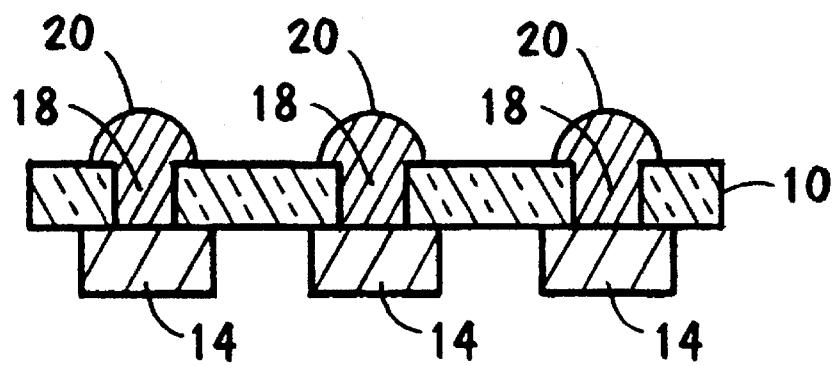

Next, as shown in FIG. 1D, the openings 16 are filled with a metal plug 18 having a raised contact 20. The metal plugs 18 and contacts 20 can be formed as a unitary structure using an electroplating process. Each raised contact 20 is generally convex in shape.

Figure 1E:
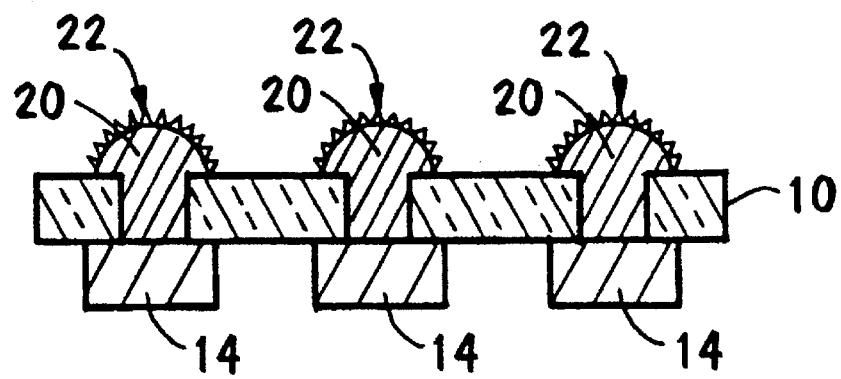

Next, as shown in FIG. 1E, a rough textured surface 22 is formed on each raised contact 20. The rough textured surface 22 can be formed by depositing a rough metal layer on the raised contacts 22 using an electroplating process. Alternately, the rough textured surface 22 can be formed by etching the surfaces of the raised contacts 20 using a wet or dry etching process.

Figure 2:
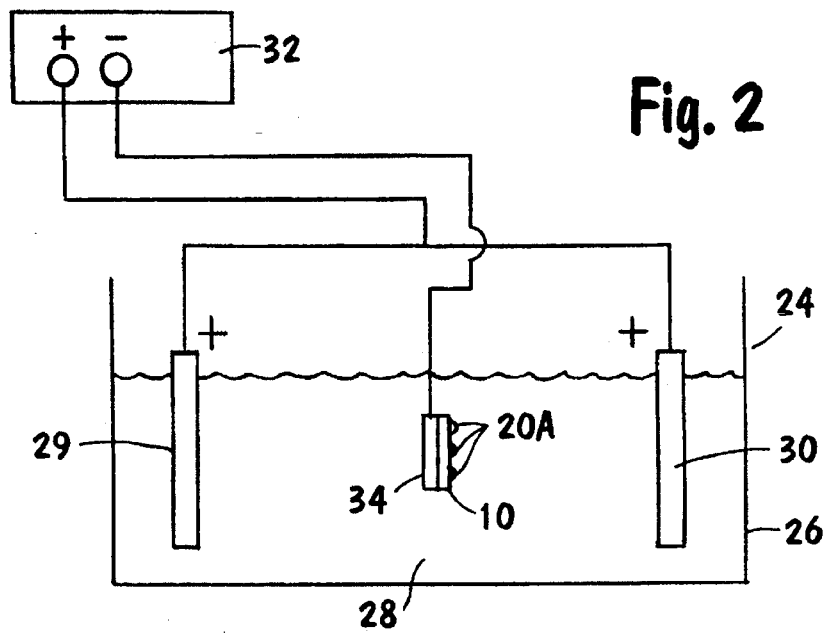
FIG. 2 is a schematic view of an electrolytic plating apparatus for depositing a rough textured metal layer on a contact formed of a base metal in accordance with the method of the invention.
Figure 3:
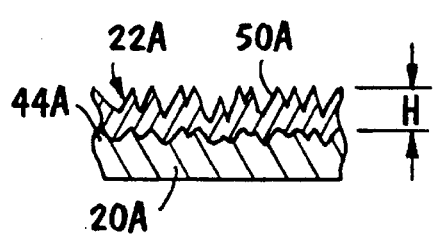
FIG. 3 is an enlarged cross sectional view of a rough textured metal layer plated onto the surface of a raised contact formed of a base metal in accordance with the invention.

Referring to FIGS. 2 and 3, an electrolytic plating process for forming the rough textured surfaces 22 on the raised contacts 20 is shown. During the electrolytic plating process the parameters of the process are controlled to form a rough textured metal layer 22A (FIG. 3) with oxide penetrating asperities 50A.

The electroplating apparatus 24 includes a tank 26 filled with an electrolytic solution 28. The electrolytic solution 28 is a conductive liquid that includes water, metal ions and a salt such as sodium chloride (NaCl). Pairs of anodes 29, 30 are submerged in the electrolytic solution 28. Each anode 29, 30 is electrically connected to the positive electrode of a power source 32. Depending on the metal being plated, the anodes 29, 30 are formed of a material that will supply positive ions to the electrolytic solution 28. As an example for forming a layer of aluminum, the anodes 29, 30 will also be formed of aluminum. A holder 34 is submerged in the electrolytic solution and connected to the negative electrode of the power source 32.

The polyimide substrate 10 is mounted to the holder 34 with the conductive traces 14 and contacts 20A electrically connected to the negative electrode of the power source 32. During the plating process, process parameters (e.g., temperature, current density, composition of electrolytic solution) are controlled to produce a rough plated layer. One process parameter that can be controlled to produce a rough plated layer is the chemical composition of the electrolytic solution. Specifically, the presence or concentration of brighteners in the solution will affect the grain structure and texture of the plated material. The term brightener refers to any substance added to an electrolytic solution to enhance the formation of a finer or denser grain structure in the plated material. Such brighteners are usually adsorbed or diffused into the plated layer. Brighteners, such as carbon, are routinely added to electrolytic solutions during electrolytic plating to produce a smooth plated surface.

In order to produce a rough textured surface, the brighteners are either totally excluded from the electrolytic solution 28 or added in reduced quantities from those normally used. By controlling the brighteners, the textured metal layer 22A (FIG. 3) will form with a rough texture that conforms to the surface of the base metal that forms the contacts 20A. Any scratches, burrs or pores in the surface of the contacts 20A will be magnified in the textured metal layer 22A.

FIG. 3 is a schematic cross sectional view illustrating the surfaces of the raised contact 20A and the rough textured metal layer 22A magnified several hundred times. The contact 20A is formed initially with a rough surface 44A. The rough surface 44A of the contact 20A includes peaks and valleys formed by scratches and burrs present on the surface of the base metal. Some surface roughness occurs naturally during formation of the contact 20A. As an example, during formation of contact using an electroplating process (20, FIG. 1D) a imperfect surface is formed that includes scratches and burrs. The contact 20A can also be further roughened or scratched using an abrasive medium such as a wire brush, emery wheel, or sandpaper prior to deposition of the rough metal layer 22A.

During the subsequent electroplating process, the textured metal layer 22A is deposited on the surface 44A of the contact 20A and asperities 50A are formed. The asperities are raised areas or nodules that form during deposition of the textured metal layer 22A. These asperities 50A have a random shape. Some of the asperities 50A will have a pointed or sharpened peripheral configuration.

During the rough plating process, the asperities 50A form over the contour of the rough surface 44A of the contact 20A and are magnified by the electroplating process. This is a well known phenomena that occurs in electroplating and can be alleviated by adding organic brighteners to the electrolytic solution 28. In the present case this phenomena is encouraged because a rough textured surface is desired. In addition, the voltages and duration of the plating process are controlled to enhance the production of a rough surface.

Such a rough textured metal layer 22A will have the ability to penetrate a semiconductor die pad 48 (FIG. 5) and pierce any native oxide (not shown) present on the pad 48. At the same time, the penetration depth into the die pad 48 will be limited by the height "H" of the asperities 50A (FIG. 3). The height H is preferably on the order of 1000Å to 10,000Å, with about 5000Å being the average. This height H will also be approximately the same as the thickness of the textured metal layer 22A.

The plating metal for forming the textured metal layer 22A is one that has a more positive electromotive potential than the base metal that forms the contact 20A. Table 1 lists the normal electrode potential of the metals in the electromotive series.

TABLE 1

| Metal | ELECTROMOTIVE SERIES Normal Electrode Potential (Volts) |
|---|---|
| Gold | +1.4 |
| Platinum | +1.2 |
| Iridium | +1.0 |
| Palladium | +0.83 |
| Silver | +0.8 |
| Mercury | +0.799 |
| Osmium | +0.7 |
| Ruthenium | +0.45 |
| Copper | +0.344 |
| Bismuth | +0.20 |
| Antimony | +0.1 |
| Tungsten | +0.5 |
| Hydrogen | +0.000 |
| Lead | −0.126 |
| Tin | −0.163 |
| Molybdenum | −0.2 |
| Nickel | −0.25 |
| Cobalt | −0.28 |
| Indium | −0.3 |
| Cadmium | −0.402 |
| Iron | −0.440 |
| Chromium | −0.56 |
| Zinc | −0.762 |
| Niobium | −1.1 |
| Manganese | −1.05 |
| Vanadium | −1.5 |
| Aluminum | −1.67 |
| Beryllium | −1.70 |

TABLE 1-continued

| Metal | ELECTROMOTIVE SERIES Normal Electrode Potential (Volts) |
|---|---|
| Titanium | −1.75 |
| Magnesium | −2.38 |
| Calcium | −2.8 |
| Strontium | −2.89 |
| Barium | −2.90 |
| Potassium | −2.92 |

As an example, for a contact 20A formed of aluminum or nickel as a base metal, suitable metals for forming the textured metal layer 22A include nickel, molybdenum, tungsten, copper, silver, iridium, platinum and gold.

Figure 4:
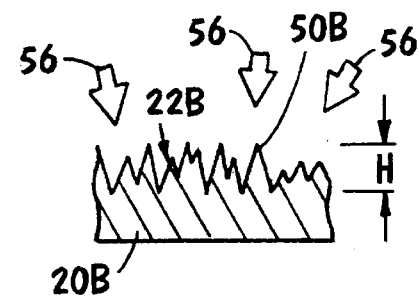
FIG. 4 is a schematic cross sectional view of a rough textured surface formed on a contact using an etching process.

With reference to FIG. 4, a rough textured surface 22B can also be formed on a raised contact 20B using an etching process. During the etching process, an etchant as indicated by arrows 56 is directed at the surface of the contact 20B. The etchant can be a wet chemical solution, such as an acid, administered by an immersion or spray process. Alternately, a dry etchant can be generated using a dry etch method, such as plasma etching, ion milling or reactive ion etching.

The etching process is controlled to form pointed or sharpened asperities 50B. As before the asperities will have a height on the order of 1000Å to 10,000Å.

Figure 5:
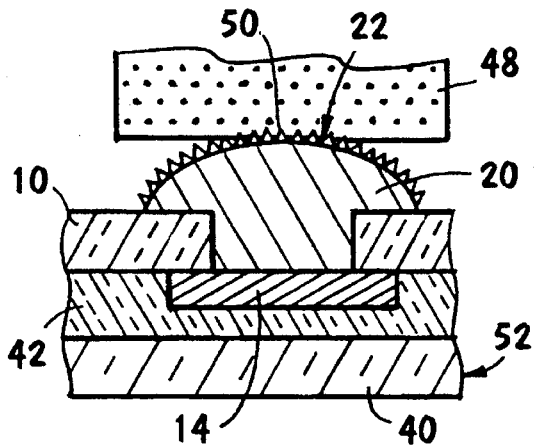
FIG. 5 is a cross sectional view of a portion of an interconnect having contacts formed in accordance with the invention with a rough textured surface.

With reference to FIG. 5, a portion of an interconnect 52 that includes raised contacts 20 plated with a rough textured surface 22 is shown. The interconnect 52 provides a connection system that allows electrical testing (e.g., burnin) to be performed on an unpackaged semiconductor die. The rough textured surface 22 is formed using an electroplating process or using an etching process as previously described. As shown in FIG. 5, the interconnect 52 includes a rigid substrate 40 formed of a material such as silicon, silicon-on-sapphire (SOS), silicon-on-glass (SOG), germanium, or a ceramic. In general, these materials have a coefficient of thermal expansion (CTE) that is the same, or very close, to the CTE of a silicon die. For forming the interconnect 52, the polyimide substrate 10 is attached to the rigid substrate 40 using an adhesive layer 42.

In use, the interconnect 52 can be placed along with an unpackaged die, in a carrier for testing. Such a carrier is disclosed in U.S. Pat. No. 5,320,891 to Wood et al. entitled "Discrete Die Burn-In For Non-Packaged Die". With this type of carrier, the conductive traces 14 on the interconnect 52 are placed in electrical communication with external contacts on the carrier. These external contacts are connected to external test circuitry for testing the unpackaged die. The die includes the die pads 48 (FIG. 5) which are contacted by the contacts 20 of the interconnect 52. In use of the interconnect 52 for testing a discrete die, the compliancy (i.e., flexibility, resiliency) of the polyimide substrate 10 and the adhesive layer 42 compensate for height variations in the die pads 48.

As shown in FIG. 5, the asperities 50 of the rough textured surface 22 penetrate into the die pad 48 to make an electrical connection. The asperities 50 form the actual region of contact between the mating surfaces. The asperities 50 are adapted to completely penetrate any oxide covering the die pad 48 and allow a low-resistance ohmic connection to be made. Although the asperities 50 are able to penetrate into the die pad 48, the large surface area provided by the contacts 20 limits the penetration depth of the contacts 20 into the die pad 48.

Figure 6:
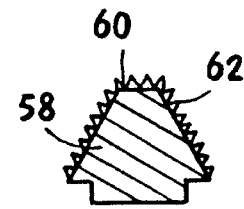
FIG. 6 is an enlarged cross sectional view of an alternate embodiment raised contact formed in accordance with the invention with a rough textured surface.

In addition to convex or hemispherical shaped contacts, a contact structure can be formed in other shapes. As one example, FIG. 6 shows a contact 58 formed as a truncated cone with a flat tip 60. A rough textured surface 62 is formed on the contact 58 using an electroplating process or an etching process, as previously described. As with the prior embodiments, this type of contact 58 can be formed on a polyimide substrate and included as a component of an interconnect, as previously described.

Although the method of the invention has been described in connection with raised contacts formed as microbumps, the method of the invention can be used with other types of contact structures. In general, any contact structure that includes a base metal, can be plated or etched in accordance with the invention to form a rough textured, oxide penetrating surface. It is intended therefore, that alternate embodiments of the inventive concepts expressed herein be included within the scope of the following claims.

What is claimed is:

1. A method for forming a contact structure for forming an electrical connection with a contact location on a semiconductor die, said method comprising:

forming a compliant substrate;

mounting a raised contact on the substrate;

forming a rough textured surface on the raised contact, said rough textured surface including raised asperities adapted to penetrate said contact location to a penetration depth; and establishing an electrical path on the substrate to the raised contact.

2. The method as claimed in claim 1 and further comprising:

forming the rough textured surface as a metal layer using an electrolytic plating process.

3. The method as claimed in claim 1 and further comprising:

forming the rough textured surface by etching the raised contact.

4. The method as claimed in claim 1 and wherein:

mounting the raised contact is by etching an opening in the substrate and filling the opening with a metal plug having an exposed bump. .

5. The method as claimed in claim 1 and wherein:

establishing the electrical path is using a conductive trace formed on the substrate and attached to the raised contact.

6. The method as claimed in claim 1 and further comprising:

forming an interconnect by attaching the substrate to a rigid substrate formed of a material selected from the group consisting of silicon, silicon-on-sapphire, silicon-on-glass, germanium, and ceramic.

7. The method as claimed in claim 6 and further comprising testing an unpackaged semiconductor die using the interconnect.

8. The method as claimed in claim 1 and wherein:

the raised contact is convex in shape.

9. The method as claimed in claim 1 and wherein:

the raised contact is generally conical in shape.

10. The method as claimed in claim 1 and wherein:

the asperities on the raised contact have a height of from 1000Å to 10,000Å.

11. A method for forming a contact structure for forming an electrical connection with a contact location on a semiconductor die, said method comprising:

forming an electrically insulating compliant substrate;

forming an opening through the substrate;

filling the opening with a conductive material and forming a bump on the conductive material out of a base metal;

forming a rough textured surface on the bump, said textured surface including asperities adapted to penetrate into said contact location to a penetration depth.

12. The method as claimed in claim 11 and wherein:

forming a rough textured surface is with an electrolytic plating process in which process parameters are controlled to form the asperities.

13. The method as claimed in claim 12 and wherein:

a concentration of brighteners in the electrolytic solution is controlled to form an asperities.

14. The method as claimed in claim 13 and wherein:

the asperities have a height of from 1000Å to 10,000Å.

15. The method as claimed in claim 11 and wherein forming a rough textured surface is by etching the bump.

16. The method as claimed in claim 11 and further comprising:

attaching the compliant substrate to a rigid substrate to form an interconnect.

17. A method for forming a contact structure for establishing an electrical connection with a contact location on a semiconductor die, said method comprising:

providing a compliant substrate;

forming an electrically conductive trace on the compliant substrate;

etching an opening through the compliant substrate to the conductive trace;

forming a raised contact on the opening in electrical communication with the conductive trace;

forming a rough textured surface on the raised contact having pointed asperities of from 1000Å to 10,000Å adapted to penetrate into the contact location to a limited penetration depth.

18. The method as claimed in claim 17 and wherein:

forming a rough textured surface is by electroplating a rough metal layer on the raised contact.

19. The method as claimed in claim 18 and further comprising:

roughening a surface of the raised contact prior to electroplating.

20. The method as claimed in claim 17 and wherein:

forming a rough textured surface is by etching the raised contact.

21. The method as claimed in claim 20 and wherein:

etching is using a process selected from the group consisting of dry etching and wet etching.

22. The method as claimed in claim 17 and wherein:

the complaint substrate is formed of a polyimide material.

23. A method for forming a contact structure for establishing an electrical connection with a contact location on a semiconductor die, said method comprising:

providing an electrically insulative compliant substrate;

forming a raised contact of a base metal on the substrate;

forming a rough surface on the raised contact by etching the base metal to form asperities adapted to penetrate the contact location to a limited penetration depth; and establishing an electrical path on the substrate to the raised contact.

24. The method as claimed in claim 23 and wherein:

the insulative substrate comprises polyimide tape etched with an opening for the raised contact and a conductive trace is formed on the substrate in electrical communication with the raised contact.

25. The method as claimed in claim 23 and further comprising:

attaching the compliant substrate to a rigid substrate to form an interconnect for testing unpackaged semiconductor dice.

26. The method as claimed in claim 23 and wherein:

the asperities have a height of about 1000Å to 10,000Å.

27. The method as claimed in claim 23 and wherein:

the etching process is selected from the group of processes consisting of wet etching and dry etching.

28. The method as claimed in claim 23 and wherein:

the etching process is performed using a wet etchant.

29. The method as claimed in claim 28 and wherein:

the wet etchant is an acid.

30. A method for forming a contact structure for establishing an electrical connection with a contact location on a semiconductor die, said method comprising:

forming a compliant substrate;

forming an electrically conductive trace on the compliant substrate;

etching an opening through the compliant substrate to the conductive trace;

filling the opening with a conductive material in electrical communication with the conductive trace;

forming a raised contact on the conductive material; and forming a rough textured surface on the raised contact adapted to penetrate into the contact location to a limited penetration depth.

31. The method as claimed in claim 30 and wherein:

forming a rough textured surface is by electroplating a metal layer on the raised contact.

32. The method as claimed in claim 30 and wherein:

forming a rough textured surface is by etching the raised contact.

33. The method as claimed in claim 30 and wherein:

the complaint substrate is formed of a polyimide material.

34. The method as claimed in claim 30 and wherein the raised contact and conductive material are formed of a same metal.

35. The method as claimed in claim 30 and wherein the raised contact and conductive material are formed by an electroplating process.

36. The method as claimed in claim 30 and wherein the asperities have a height of from 1000Å to 10,000Å.

37. The method as claimed in claim 30 and further comprising testing a semiconductor die using the contact structure.

* * * * *